United States Patent
Chow et al.

(10) Patent No.: US 8,188,586 B2
(45) Date of Patent: May 29, 2012

(54) MOUNTABLE INTEGRATED CIRCUIT PACKAGE SYSTEM WITH MOUNTING INTERCONNECTS

(75) Inventors: Seng Guan Chow, Singapore (SG); Heap Hoe Kuan, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 224 days.

(21) Appl. No.: 11/934,069

(22) Filed: Nov. 1, 2007

(65) Prior Publication Data
US 2009/0115043 A1 May 7, 2009

(51) Int. Cl.
*H01L 23/02* (2006.01)
(52) U.S. Cl. ............... 257/686; 257/787; 257/E23.023
(58) Field of Classification Search .......... 257/686, 257/787, E23.023
See application file for complete search history.

(56) References Cited

U.S. PATENT DOCUMENTS

| | | | |
|---|---|---|---|
| 6,407,448 B2 * | 6/2002 | Chun | 257/678 |
| 6,861,288 B2 | 3/2005 | Shim et al. | |
| 6,933,598 B2 | 8/2005 | Karnezos | |
| 7,109,576 B2 | 9/2006 | Bolken et al. | |
| 7,169,642 B2 * | 1/2007 | Karnezos | 438/108 |
| 7,391,105 B2 * | 6/2008 | Yeom | 257/686 |
| 7,534,664 B2 | 5/2009 | Watanabe | |
| 2005/0090050 A1 | 4/2005 | Shim et al. | |
| 2007/0187826 A1 | 8/2007 | Shim et al. | |
| 2008/0105962 A1 * | 5/2008 | Lee et al. | 257/686 |
| 2009/0091015 A1 * | 4/2009 | Shen et al. | 257/686 |

* cited by examiner

*Primary Examiner* — Jenny L Wagner
(74) *Attorney, Agent, or Firm* — Ishimaru & Associates LLP; Mikio Ishimaru; Stanley Chang

(57) ABSTRACT

A mountable integrated circuit package system includes: mounting a first integrated circuit device over a carrier; mounting a substrate over the first integrated circuit device, the substrate having a mounting interconnect; connecting a first electrical interconnect between the carrier and the substrate; and forming a package encapsulation covering the carrier, the first integrated circuit device, the first electrical interconnect, and the substrate with the mounting interconnect partially exposed from and surrounded by the package encapsulation within a cavity of the package encapsulation.

25 Claims, 5 Drawing Sheets

MOUNTABLE INTEGRATED CIRCUIT PACKAGE SYSTEM WITH MOUNTING INTERCONNECTS

TECHNICAL FIELD

The present invention relates generally to integrated circuit package system and more particularly to an integrated circuit package system having an encapsulation.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages, a package in package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs all of which are primary goals of the computer industry.

Multi-chip packages with stacking configurations, or PIP, may also present problems. Spacer structures may be used to create space for electrical connections in the stacked structure. Package structures contain packaged integrated circuits in the stacked structures. Typical spacer structures and the encapsulation material of the packaged integrated circuits have low adhesion and become a source of delamination. Conventional spacer and packaged integrated circuits interface perform poorly in reliability test from the delamination at this interface.

Thus, a need still remains for an integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package system including: mounting a first integrated circuit device over a carrier; mounting a substrate over the first integrated circuit device, the substrate having a mounting interconnect; connecting a first electrical interconnect between the carrier and the substrate; and forming a package encapsulation covering the carrier, the first integrated circuit device, the first electrical interconnect, and the substrate with the mounting interconnect partially exposed from and surrounded by the package encapsulation within a cavity of the package encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
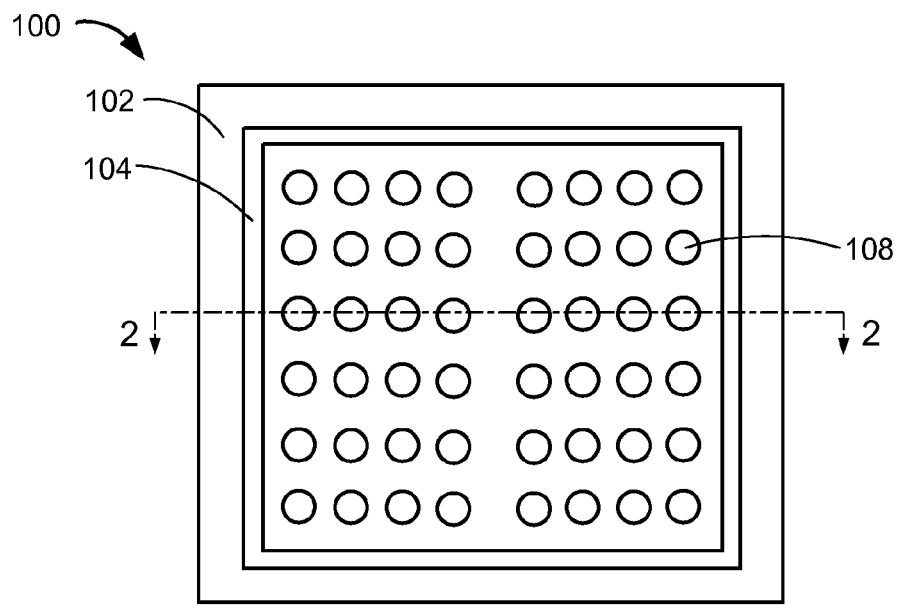
FIG. 1 is a top view of a mountable integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a mountable integrated circuit package system 100 in a first embodiment of the present invention. The top view depicts a package encapsulation 102, such as an epoxy mold compound, having a cavity 104. The cavity 104 partially exposes mounting interconnects 108, such as solder bumps exposed from and surrounded by the package encapsulation 102 within the cavity 104 of the package encapsulation 102. The mounting interconnects 108 may be formed from electrically conductive materials including tin (Sn), lead (Pb), gold (Au), copper (Cu), or metal alloys.

For illustrative purposes, the mountable integrated circuit package system 100 is shown with the mounting interconnects 108 in an configuration of a non-evenly distributed array, although it is understood that the mountable integrated circuit package system 100 may have the mounting interconnects 108 in a different configuration. For example, the mounting interconnects 108 may be in a configuration that is an evenly distributed array.

Figure 2:
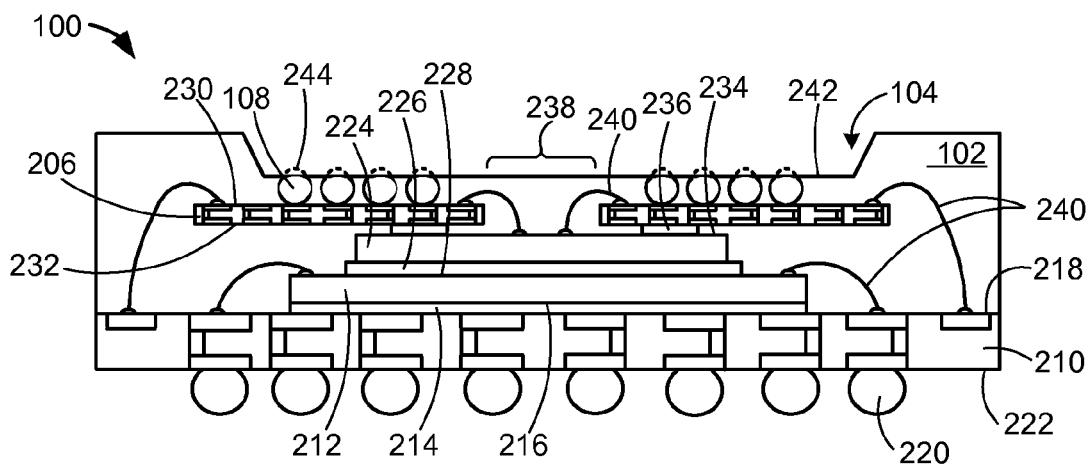
FIG. 2 is a cross-sectional view of the mountable integrated circuit package system along 2-2 of FIG. 1.

Referring now to FIG. 2, therein is shown a cross-sectional view of the mountable integrated circuit package system 100 along 2-2 of FIG. 1. The cross-sectional view depicts the mountable integrated circuit package system 100 having the package encapsulation 102 formed over a carrier 210, such as a substrate, having mounted thereon a first integrated circuit device 212, such as an integrated circuit die, a flip chip, or a packaged integrated circuit device. Preferably, the first integrated circuit device 212 is mounted with a first adhesive 214 such as a die-attach adhesive, with a first non-active side 216 of the first integrated circuit device 212 facing a first carrier side 218 of the carrier 210. Second external interconnects 220, such as solder balls, are attached to a second carrier side 222 of the carrier 210, opposing the first carrier side 218, for connection to the next system level (not shown), such as a printed circuit board or another integrated circuit package system.

Optionally, a second integrated circuit device 224 may be mounted over the first integrated circuit device 212 with a second adhesive 226, such as a die attach adhesive. Although this example is shown with two integrated circuit devices stacked above the carrier 210 and under a substrate 206, it is understood that any number of integrated circuit devices may be mounted over the first carrier side 218 and under the substrate 206.

For illustrative purposes, the first integrated circuit device 212 and the second integrated circuit device 224 are shown as a wire bond integrated circuit, although it is understood that the first integrated circuit device 212 and the second integrated circuit device 224 may be of a different type of integrated circuits. For example, the first integrated circuit device 212 and the second integrated circuit device 224 may be an integrated circuit die, a packaged integrated circuit device, a flip chip, or a combination thereof.

The substrate 206 includes a first substrate side 230 with the mounting interconnects 108. A second substrate side 232 of the substrate 206, opposing the first substrate side 230, is mounted over a second active side 234 of the second integrated circuit device 224 with a third adhesive 236, such as a film adhesive. In this example, the substrate 206 includes an aperture 238 with an electrical interconnect 240, such as a bond wire or a ribbon bond wire, connecting the second active side 234 with the first substrate side 230 through the aperture 238. The electrical interconnect 240 may also provide electrical connection between the first carrier side 218 and a first active side 228. Similarly, the electrical interconnect 240 may also connect the first carrier side 218 and the first substrate side 230.

The package encapsulation 102 covers the first carrier side 218, the first integrated circuit device 212, the second integrated circuit device 224, the electrical interconnect 240, and the first substrate side 230. The package encapsulation 102 includes the cavity 104 over the first substrate side 230, with the mounting interconnects 108 partially exposed from and surrounded by the package encapsulation 102 within the cavity 104. The mounting interconnects 108 are coplanar with a first encapsulation side 242 of the package encapsulation 102 in the cavity 104. The mounting interconnects 108, such as solder bumps of spherical, pillar or stud configuration, for example, may be flattened using coining, pressing, or other planarization process. The mounting interconnects 108 accommodate mounting another integrated circuit device (not shown) over the first encapsulation side 242. Optionally, it is also understood that the mounting interconnects 108 may include a protrusion 244 protruding above the first encapsulation side 242, such as shown in dotted lines within the cavity 104.

It has been discovered that the present invention reduces package height and improves package reliability with the mounting interconnects partially exposed or protruding from the cavity of the package encapsulation. The mountable integrated circuit package system 100 provides for reliable electrical connectivity between the mountable integrated circuit package system 100 and a mounting integrated circuit device that may mount over the mounting interconnects, while minimizing the overall height of the integrated circuit packages system. The mounting interconnects provides sufficient standoff height above the substrate to minimize bond wire sweep issue on the substrate, or on conductive contacts of the substrate when attaching the mounting integrated circuit device.

It has also been discovered that the present invention provides a sufficient standoff height above the substrate to help minimize the mold flow disturbance that may cause mold flash or mold bleed contamination on conductive contacts on the substrate. The invention further accommodates bond wires between a central interconnect pad of an integrated circuit device under the substrate and a top side of the substrate through an aperture in the substrate, without interfering with top mold chase during encapsulation process. The invention also prevents exposed wires after the encapsulation process due to possible tilting of the substrate.

It has been further discovered that the present invention obviates the need for a mounting integrated device having a large solder ball size, as well as pitch size, in order to clear the pre-encapsulated mold cap for inner central bond wires.

Figure 3:
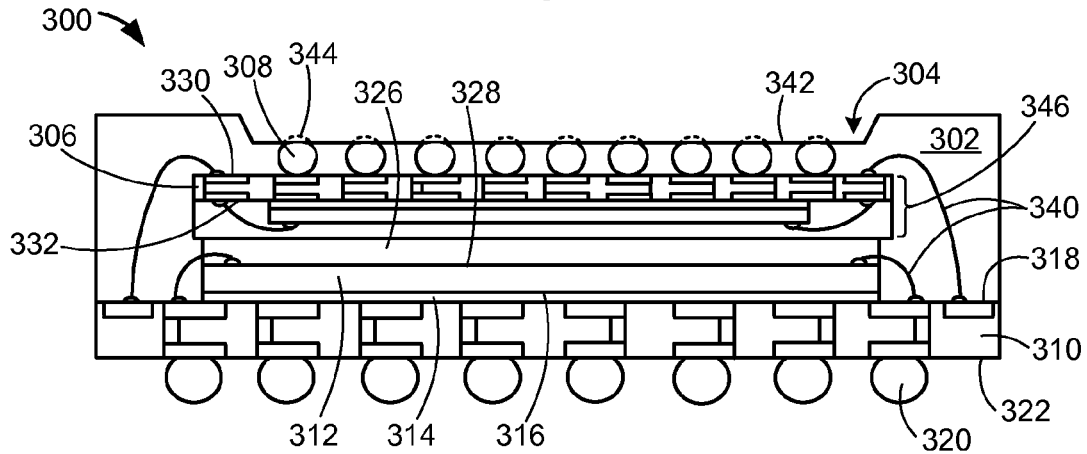
FIG. 3 is a cross-sectional view of a mountable integrated circuit package system having a top view exemplified by FIG. 1 in a second embodiment of the present invention.

Referring now to FIG. 3, therein is shown a cross-sectional view of a mountable integrated circuit package system 300 having a top view exemplified by FIG. 1 in a second embodiment of the present invention. The mountable integrated circuit package system 300 includes structural similarities to the mountable integrated circuit package system 100 of FIG. 2. The cross-sectional view depicts the mountable integrated circuit package system 300 having a package encapsulation 302 formed over a carrier 310, such as a substrate, having mounted thereon a first integrated circuit device 312, such as an integrated circuit die, a flip chip, or a packaged integrated circuit device. Preferably, the first integrated circuit device 312 is mounted with a first adhesive 314 such as a die-attach adhesive, with a first non-active side 316 of the first integrated circuit device 312 facing a first carrier side 318 of the carrier 310. Second external interconnects 320, such as solder balls, are attached to a second carrier side 322 of the carrier 310, opposing the first carrier side 318, for connection to the next system level (not shown), such as a printed circuit board or another integrated circuit package system.

Although the first integrated circuit device 312 is shown as a wire bond integrated circuit, it is understood that the first integrated circuit device 312 may be of a different type of integrated circuit. For example, the first integrated circuit device 312 may be an integrated circuit die, a packaged integrated circuit device, or a flip chip.

A second packaged integrated circuit device 346 is mounted over a first active side 328 of the first integrated circuit device 312 with a second adhesive 326, such as a wire-in-film adhesive. The second packaged integrated circuit device 346 includes a substrate 306, such as a multi-layer substrate, having a first substrate side for interface pads 330, with mounting interconnects 308 coupled to the interface pads 330, and a second substrate side for coupling pads 332 opposing the first substrate side and facing over the first integrated circuit device 312.

An electrical interconnect 340, such as a bond wire or a ribbon bond wire, connects between the first carrier side 318 and the first substrate side 330. The electrical interconnect 340 may also provide electrical connection between the first carrier side 318 and the first active side 328.

The package encapsulation 302 covers the first carrier side 318, the first integrated circuit device 312, the second packaged integrated circuit device 346, the first substrate side 330, and the electrical interconnect 340. The package encapsulation 302 includes a cavity 304 over the first substrate side 330, with the mounting interconnects 308 partially exposed from and surrounded by the package encapsulation 302 within the cavity 304. The mounting interconnects 308 are coplanar with a first encapsulation side 342 of the package encapsulation 302 in the cavity 304. The mounting interconnects 308, such as solder bumps of spherical, pillar or stud configuration, for example, preferably may be flattened using coining, pressing, or other planarization process. The mounting interconnects 308 accommodate mounting another integrated circuit device (not shown) over the first encapsulation side 342. Optionally, it is also understood that the mounting interconnects 308 may include a protrusion 344 protruding above the first encapsulation side 342, such as shown in dotted lines within the cavity 304.

Figure 4:
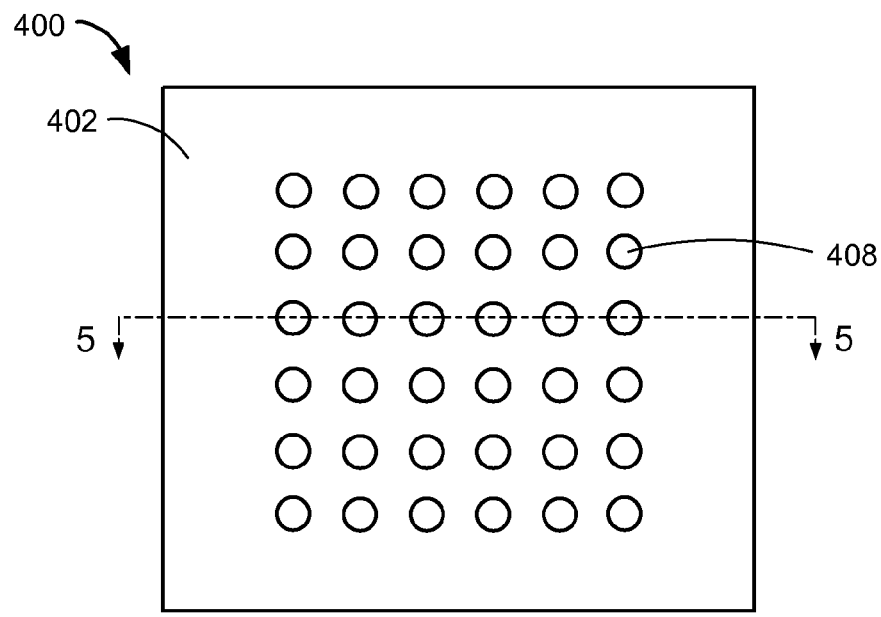
FIG. 4 is a top view of a mountable integrated circuit package system in a third embodiment of the present invention.

Referring now to FIG. 4, therein is shown a top view of a mountable integrated circuit package system 400 in a third embodiment of the present invention. The top view depicts a package encapsulation 402, such as an epoxy mold compound, having partially exposed mounting interconnects 408, such as solder bumps partially exposed from and surrounded by the package encapsulation 402. The mounting interconnects 408 may be formed from electrically conductive materials including tin (Sn), lead (Pb), gold (Au), copper (Cu), or metal alloys.

Figure 5:
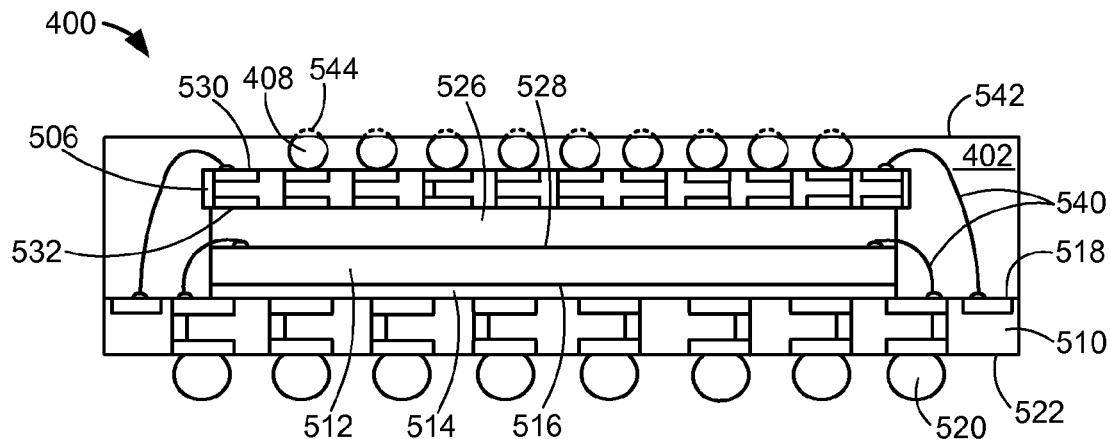
FIG. 5 is a cross-sectional view of the mountable integrated circuit package system along 5-5 of FIG. 4.

Referring now to FIG. 5, therein is shown a cross-sectional view of the mountable integrated circuit package system 400 along 5-5 of FIG. 4. The cross-sectional view depicts the mountable integrated circuit package system 400 having the package encapsulation 402 formed over a carrier 510, such as a substrate, having mounted thereon a first integrated circuit device 512, such as an integrated circuit die, a flip chip, or a packaged integrated circuit device. Preferably, the first integrated circuit device 512 is mounted with a first adhesive 514 such as a die-attach adhesive, with a first non-active side 516 of the first integrated circuit device 512 facing a first carrier side 518 of the carrier 510. Second external interconnects 520, such as solder balls, are attached to a second carrier side 522 of the carrier 510, opposing the first carrier side 518 for connection to the next system level (not shown), such as a printed circuit board or another integrated circuit package system.

Although the first integrated circuit device 512 is shown as a wire bond integrated circuit, it is understood that the first integrated circuit device 512 may be of a different types of integrated circuit. For example, the first integrated circuit device 512 may be an integrated circuit die, a packaged integrated circuit device, a flip chip, or a combination thereof. An electrical interconnect 540, such as a bond wire or a ribbon bond wire, connects between the first carrier side 518 and a first active side 528 of the first integrated circuit device 512.

A substrate 506 having a first substrate side 530 with the mounting interconnects 408, and a second substrate side 532 of the substrate 506, opposing the first substrate side 530, is mounted over the first active side 528 with a second adhesive 526, such as a wire-in-film adhesive. Preferably, the electrical interconnect 540 may also connect the first carrier side 518 and the first substrate side 530.

The package encapsulation 402 covers the first carrier side 518, the electrical interconnect 540, the first integrated circuit device 512, and the first substrate side 530. The mounting interconnects 408 are partially exposed from and surrounded by the package encapsulation 402. The mounting interconnects 408 are coplanar with a first encapsulation side 542 of the package encapsulation 402. The mounting interconnects 408, such as solder bumps of spherical, pillar or stud configuration, for example, may be flattened using coining, pressing, other planarization process. The mounting interconnects 408 accommodate mounting another integrated circuit device (not shown) over the first encapsulation side 542. Optionally, it is also understood that the mounting interconnects 408 may include a protrusion 544 protruding above the first encapsulation side 542, such as shown in dotted lines.

Figure 6:
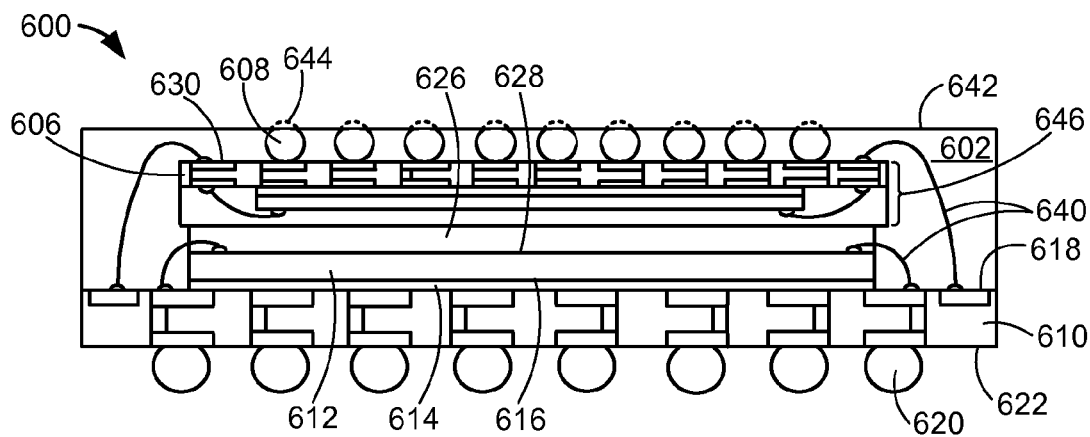
FIG. 6 is a cross-sectional view of a mountable integrated circuit package system having a top view exemplified by FIG. 4 in a fourth embodiment of the present invention.

Referring now to FIG. 6, therein is shown a mountable integrated circuit package system 600 having a top view exemplified by FIG. 4 in a fourth embodiment of the present invention. The mountable integrated circuit package system 600 includes structural similarities to the mountable integrated circuit package system 400 of FIG. 5. The cross-sectional view depicts the mountable integrated circuit package system 600 having a package encapsulation 602 formed over a carrier 610, such as a substrate, having mounted thereon a first integrated circuit device 612, such as an integrated circuit die, a flip chip, or a packaged integrated circuit device. Preferably, the first integrated circuit device 612 is mounted with a first adhesive 614 such as a die-attach adhesive, with a first non-active side 616 of the first integrated circuit device 612 facing a first carrier side 618 of the carrier 610. Second external interconnects 620, such as solder balls, are attached to a second carrier side 622 of the carrier 610, opposing the first carrier side 618 for connection to the next system level (not shown), such as a printed circuit board or another integrated circuit package system.

Although the first integrated circuit device 612 is shown as a wire bond integrated circuit, it is understood that the first integrated circuit device 612 may be of a different types of integrated circuit. For example, the first integrated circuit device 612 may be an integrated circuit die, a packaged integrated circuit device, or a flip chip.

A second packaged integrated circuit device 646 is mounted over a first active side 628 of the first integrated circuit device 612 with a second adhesive 626, such as a wire-in-film adhesive. The second packaged integrated circuit device 646 comprises a substrate 606 having a first substrate side 630 with mounting interconnects 608. An electrical interconnect 640, such as a bond wire or a ribbon bond wire, connects between the first carrier side 618 and the first substrate side 630. The electrical interconnect 640 may also provide electrical connection between the first carrier side 618 and the first active side 628.

The package encapsulation 602 covers the first carrier side 618, the first integrated circuit device 612, the second packaged integrated circuit device 646, including the first substrate side 630, and the electrical interconnect 640. The mounting interconnects 608 are partially exposed from and surrounded by the package encapsulation 602. The mounting interconnects 608 are coplanar with a first encapsulation side 642 of the package encapsulation 602. The mounting interconnects 608 such as solder bumps of spherical, pillar or stud configuration, for example, preferably may be flattened using coining, pressing, other planarization process. The mounting interconnects 608 accommodate mounting another integrated circuit device (not shown) over the first encapsulation side 642. Optionally, it is also understood that the mounting interconnects 608 may comprise a protrusion 644 protruding above the first encapsulation side 642, such as shown in dotted lines.

Figure 7:
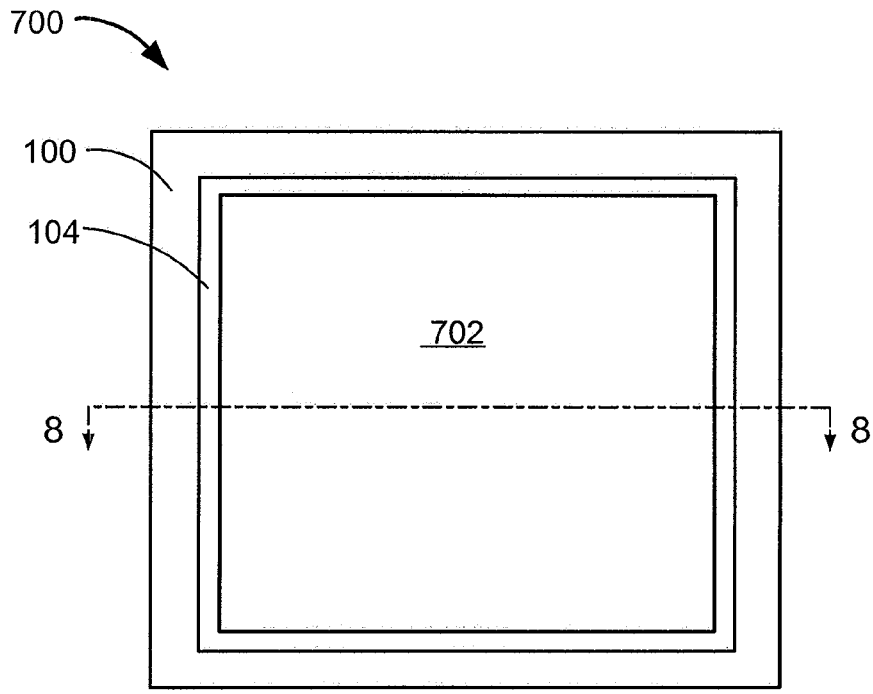
FIG. 7 is a top view of an integrated circuit package-on-package system in an application with the mountable integrated circuit package system of FIG. 2 in a fifth embodiment of the present invention.

Referring now to FIG. 7, therein is shown a top view of an integrated circuit package-on-package system 700 in an application with the mountable integrated circuit package system 100 of FIG. 2 in a fifth embodiment of the present invention. The integrated circuit package-on-package system 700 may be formed with other embodiments of the present inventions, such as the mountable integrated circuit package system 300 of FIG. 3. A mounting integrated circuit device 702, such as a packaged integrated circuit, mounts over the mountable integrated circuit package system 100 within the cavity 104 of the mountable integrated circuit package system 100 of FIG. 2.

Figure 8:
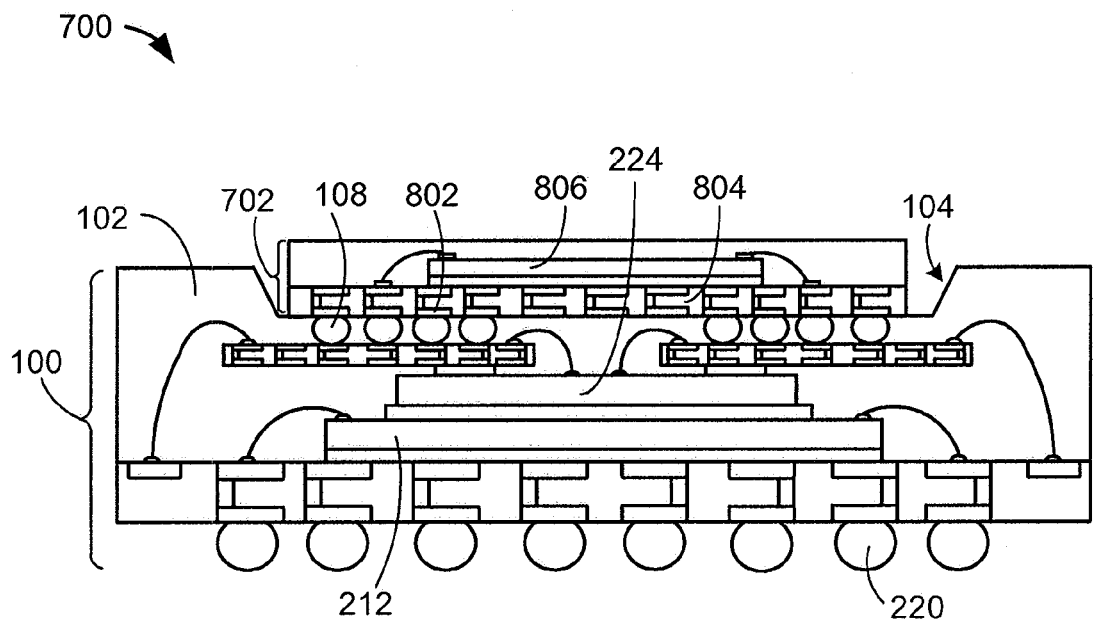
FIG. 8 is a cross-sectional view of the integrated circuit package-on-package system along 8-8 of FIG. 7.

Referring now to FIG. 8, therein is shown a cross-sectional view of the integrated circuit package-on-package system 700 along 8-8 of FIG. 7. The mounting integrated circuit device 702 is mounted over the mountable integrated circuit package system 100, over the mounting interconnects 108 exposed within the cavity 104 of the mountable integrated circuit package system 100. Preferably, mounting contacts 802, such as electrically conductive pads, exposed from a stacking substrate 804 of the mounting integrated circuit device 702, mount on and connect with the mounting interconnects 108 to provide electrical connection between a stacked integrated circuit 806, the first integrated circuit device 212, the second integrated circuit device 224, the second external interconnects 220, or a combination thereof. The stacking substrate 804 is placed directly on and directly in contact with the package encapsulation 102 with the mounting contacts 802 aligned with the mounting interconnects 108. For illustrative purposes, the integrated circuit package-on-package system 700 is shown with the mounting integrated circuit device 702 as a packaged integrated circuit, although it is understood that the integrated circuit package-on-package system 700 may be formed with different types of integrated circuit for the mounting integrated circuit device 702. For example, the mounting integrated circuit device 702 may include multiple integrated circuits, a ball grid array (BGA) device, a land grid array (LGA) device, a quad flat nonleaded (QFN) device, a quad flat package (QFP) device, a bump chip carrier (BCC) device, a flip chip, a passive component, or a combination thereof.

Figure 9:
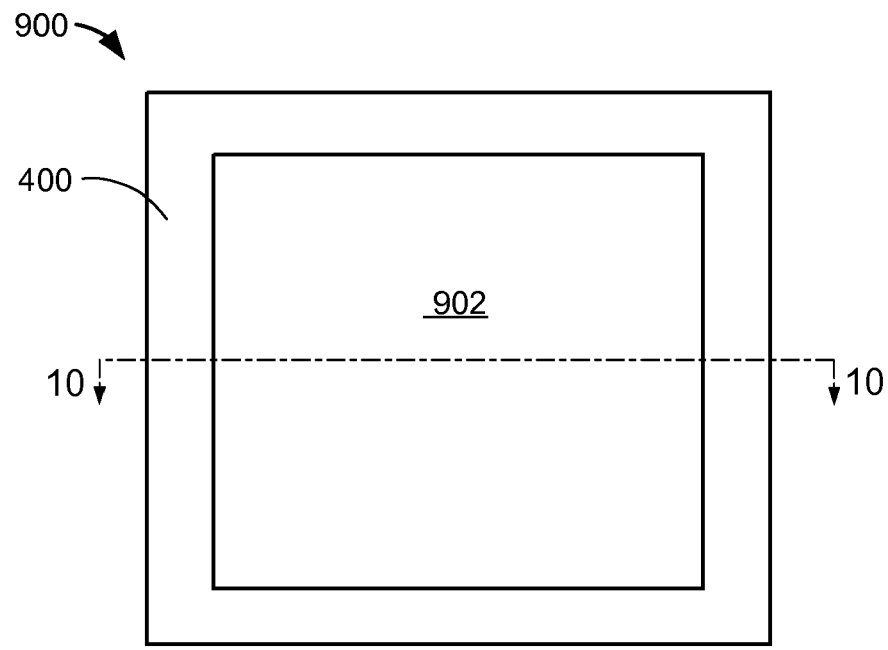
FIG. 9 is a top view of an integrated circuit package-on-package system in an application with the mountable integrated circuit package system of FIG. 5 in a sixth embodiment of the present invention.

Referring now to FIG. 9, therein is shown a top view of an integrated circuit package-on-package system 900 in an application with the mountable integrated circuit package system 400 of FIG. 5 in a sixth embodiment of the present invention. The integrated circuit package-on-package system 900 may be formed with other embodiments of the present inventions, such as the mountable integrated circuit package system 600 of FIG. 6. A mounting integrated circuit device 902, such as a packaged integrated circuit, mounts over the mountable integrated circuit package system 400 of FIG. 5.

Figure 10:
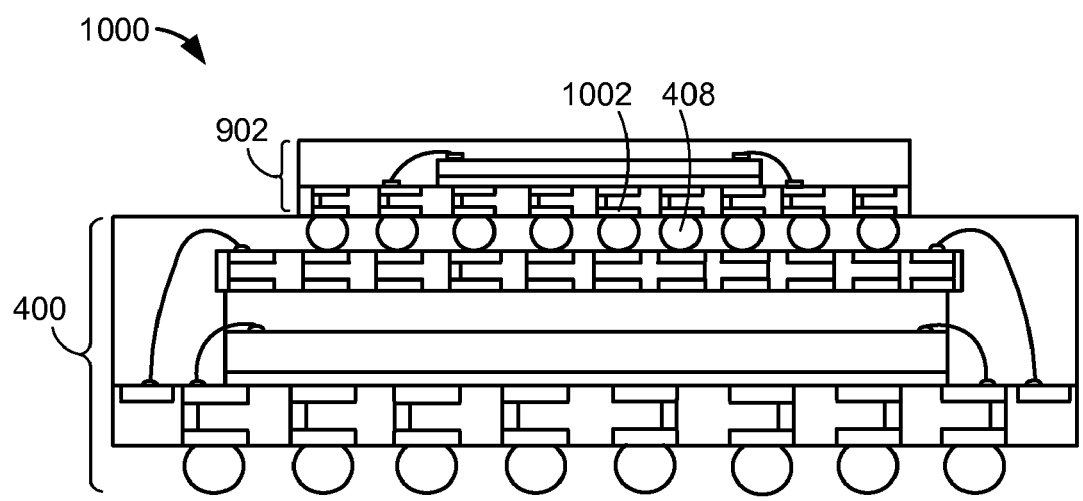
FIG. 10 is a cross-sectional view of the integrated circuit package-on-package system along 10-10 of FIG. 9.

Referring now to FIG. 10, therein is shown a cross-sectional view of the integrated circuit package-on-package system 900 along 10-10 of FIG. 9. The mounting integrated circuit device 902 is mounted over the mountable integrated circuit package system 400, over the mounting interconnects 408 of the mountable integrated circuit package system 400. Preferably, mounting contacts 1002, such as electrically conductive pads or conductive balls of the mounting integrated circuit device 902, mounts over and connect with the mounting interconnects 408 to provide electrical connection in between. For illustrative purposes, the integrated circuit package-on-package system 900 is shown with the mounting integrated circuit device 902 as a packaged integrated circuit, although it is understood that the integrated circuit package-on-package system 900 may be formed with different types of integrated circuit for the mounting integrated circuit device 902. For example, the mounting integrated circuit device 902 may include multiple integrated circuits, a ball grid array (BGA) device, a land grid array (LGA) device, a quad flat nonleaded (QFN) device, a quad flat package (QFP) device, a bump chip carrier (BCC) device, a flip chip, a passive component, or a combination thereof.

Figure 11:
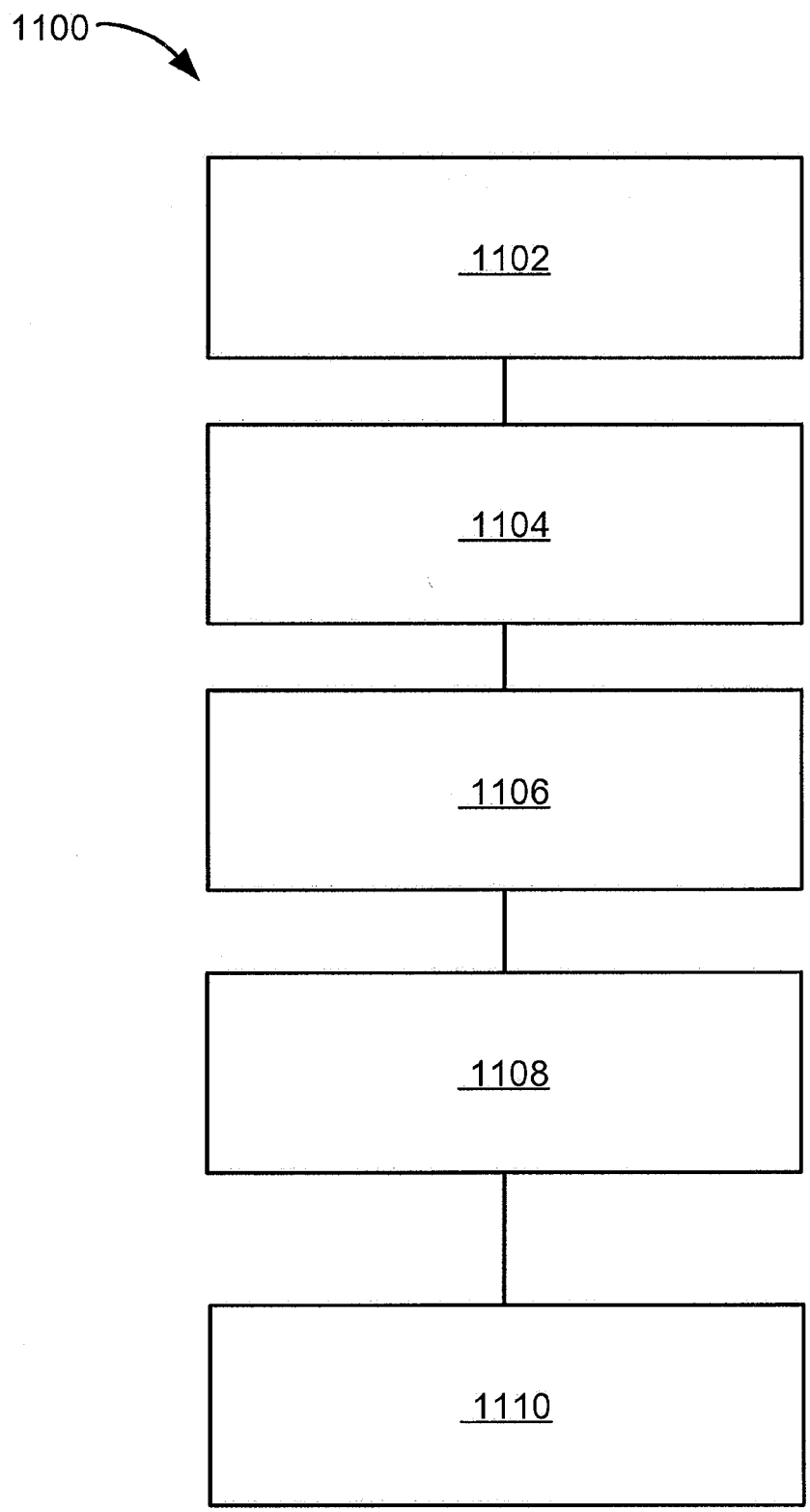
FIG. 11 is a flow chart of a mountable integrated circuit package system for manufacture of the mountable integrated circuit package system in an embodiment of the present invention.

Referring now to FIG. 11, therein is shown a flow chart of a mountable integrated circuit package system 1100 for manufacture of the mountable integrated circuit package system 100 in an embodiment of the present invention. The system 1100 includes mounting a first integrated circuit device over a carrier in a block 1102; mounting a substrate over the first integrated circuit device, the substrate having a mounting interconnect in a block 1104; connecting a first electrical interconnect between the carrier and the substrate in a block 1106; forming a package encapsulation covering the carrier, the first integrated circuit device, the first electrical interconnect, and the substrate with the mounting interconnect partially exposed from and surrounded by the package encapsulation within a cavity of the package encapsulation in a block 1108; and coupling a mounting integrated circuit device on the mounting interconnects including placing a stacking substrate directly on the mounting interconnects and the package encapsulation in a block 1110.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a mountable integrated circuit package system comprising:
    mounting a first integrated circuit device over a carrier;
    mounting a substrate, having interface pads on a first substrate side and coupling pads on a second substrate side opposite the first substrate side, over the first integrated circuit device, including coupling mounting interconnects to the interface pads;
    connecting a first electrical interconnect between the carrier and the substrate;
    forming a package encapsulation covering the carrier, the first integrated circuit device, the first electrical interconnect, and the substrate, with the mounting interconnect partially exposed from and surrounded by the package encapsulation within a cavity of the package encapsulation; and
    coupling a mounting integrated circuit device on the mounting interconnects including placing a stacking substrate directly on and in contact with the package encapsulation.

2. The method as claimed in claim 1 further comprising:
    connecting the first electrical interconnect between the first integrated circuit device and the carrier; and
    forming a wire-in-film adhesive over the first integrated circuit device and partially over the first electrical interconnect.

3. The method as claimed in claim 1 wherein forming the mounting interconnect includes exposing a protrusion of the mounting interconnect from the package encapsulation in the cavity.

4. The method as claimed in claim 1 further comprising mounting a second integrated circuit device over the mounting interconnect.

5. The method as claimed in claim 1 wherein mounting the substrate includes mounting the substrate with a third integrated circuit device mounted over the first integrated circuit device.

6. A method of manufacturing a mountable integrated circuit package system comprising:
    mounting a first integrated circuit device over a carrier;
    mounting a substrate, having interface pads on a first substrate side and coupling pads on a second substrate side opposite the first substrate side, over the first integrated circuit device, including coupling a solder bump to the interface pads;
    connecting a first electrical interconnect between the carrier and the substrate;
    forming a package encapsulation covering the carrier, the first integrated circuit device, the first electrical interconnect, and the substrate, the package encapsulation having a cavity over the first substrate side with the solder bump partially exposed from and surrounded by the package encapsulation within the cavity; and
    coupling a mounting integrated circuit device by a mounting contact on the solder bump including placing a stacking substrate directly on and in contact with the package encapsulation.

7. The method as claimed in claim 6 wherein mounting the substrate over the first integrated circuit device includes:
    forming an aperture through the substrate;
    connecting a second electrical interconnect between a first active side of the first integrated circuit device and the first substrate side through the aperture; and
    wherein forming the package encapsulation includes:
    encapsulating the aperture and the second electrical interconnect.

8. The method as claimed in claim 6 wherein mounting the substrate includes mounting the substrate with the solder bump having a spherical, a pillar or a stud configuration.

9. The method as claimed in claim 6 wherein mounting the first integrated circuit device includes mounting a further integrated circuit device over the first integrated circuit device.

10. The method as claimed in claim 6 further comprising mounting a second integrated circuit device over the solder bump within the cavity.

11. A mountable integrated circuit package system comprising:
    a carrier;
    a first integrated circuit device mounted over the carrier;
    a substrate, having interface pads on a first substrate side and coupling pads on a second substrate side opposite the first substrate side, mounted over the first integrated circuit device, includes mounting interconnects coupled to the interface pads;
    a first electrical interconnect between the carrier and the substrate;
    a package encapsulation covering the carrier, the first integrated circuit device, the first electrical interconnect, and the substrate, with the mounting interconnect partially exposed from and surrounded by the package encapsulation within a cavity of the package encapsulation; and
    a mounting integrated circuit device on the mounting interconnects includes a stacking substrate directly on and in contact with the package encapsulation.

12. The system as claimed in claim 11 wherein:
    the first electrical interconnect is between the first integrated circuit device and the carrier; and
    further comprising:

a wire-in-film adhesive over the first integrated circuit device and partially over the first electrical interconnect.

13. The system as claimed in claim 11 wherein the mounting interconnect includes a protrusion above the package encapsulation.

14. The system as claimed in claim 11 further comprising mounting contacts, exposed from the stacking substrate, coupled to the mounting interconnects.

15. The system as claimed in claim 11 wherein the substrate includes a packaged integrated circuit device mounted over the first integrated circuit device.

16. The system as claimed in claim 11 wherein the mounting interconnect includes a solder bump.

17. The system as claimed in claim 16 wherein the substrate includes:
   an aperture through the substrate;
   a second electrical interconnect between the first integrated circuit device and a first substrate side of the substrate through the aperture; and
   wherein the package encapsulation encapsulates the aperture and the second electrical interconnect.

18. The system as claimed in claim 16 wherein the first integrated circuit device includes a further integrated circuit device mounted over the first integrated circuit device and under the substrate.

19. The system as claimed in claim 16 further comprises a packaged integrated circuit device mounted over the solder bump within the cavity.

20. A method of manufacturing a mountable integrated circuit package system comprising:
   mounting a first integrated circuit device over a carrier;
   connecting a first electrical interconnect between the first integrated circuit device and the carrier;
   applying a wire-in-film adhesive over the first integrated circuit device with the wire-in-film adhesive covering a portion of the first electrical interconnect over the first integrated circuit device;
   mounting a substrate, having interface pads on a first substrate side and coupling pads on a second substrate side opposite the first substrate side, over the wire-in-film adhesive, including coupling mounting interconnects to the interface pads;
   connecting the first electrical interconnect between the carrier and the substrate;
   forming a package encapsulation over the carrier, the first integrated circuit device, the first electrical interconnect, and the substrate, with the mounting interconnect partially exposed from and surrounded by the package encapsulation; and
   coupling a mounting integrated circuit device on the mounting interconnects including placing a stacking substrate directly on and in contact with the package encapsulation.

21. The method as claimed in claim 20 further comprising planarizing the mounting interconnect coplanar with the package encapsulation.

22. The method as claimed in claim 20 wherein mounting the substrate over the wire-in-film adhesive includes mounting a packaged integrated circuit device having the substrate over the wire-in-film adhesive.

23. A mountable integrated circuit package system comprising:
   a carrier;
   a first integrated circuit device over the carrier;
   a first electrical interconnect between the first integrated circuit device and the carrier and between the carrier and a substrate;
   a wire-in-film adhesive over the first integrated circuit device with the wire-in-film adhesive covering a portion of the first electrical interconnect over the first integrated circuit device;
   the substrate, having interface pads on a first substrate side and coupling pads on a second substrate side opposite the first substrate side, over the wire-in-film adhesive, includes mounting interconnects coupled to the interface pads;
   a package encapsulation over the carrier, the first integrated circuit device, the first electrical interconnect, and the substrate, with the mounting interconnect partially exposed from and surrounded by the package encapsulation; and
   a mounting integrated circuit device on the mounting interconnects includes a stacking substrate directly on and in contact with the package encapsulation.

24. The system as claimed in claim 23 wherein the mounting interconnect is coplanar with the package encapsulation.

25. The system as claimed in claim 23 wherein the substrate over the wire-in-film adhesive is included in a packaged integrated circuit device having the substrate.

* * * * *